United States Patent
Sollner et al.

(10) Patent No.: US 8,098,182 B2
(45) Date of Patent: *Jan. 17, 2012

(54) CABLE GATEWAY USING A CHARGE-DOMAIN PIPELINE ANALOG TO DIGITAL CONVERTER

(75) Inventors: T. C. L. Gerhard Sollner, Winchester, MA (US); Michael P. Anthony, Andover, MA (US); Maher Matta, Methuen, MA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/615,397

(22) Filed: Nov. 10, 2009

(65) Prior Publication Data
US 2010/0117883 A1 May 13, 2010

Related U.S. Application Data

(60) Provisional application No. 61/113,661, filed on Nov. 12, 2008.

(51) Int. Cl.
*H03M 1/12* (2006.01)
(52) U.S. Cl. ........................ 341/172; 341/161
(58) Field of Classification Search ............ 341/161, 341/172, 155, 150; 257/215
See application file for complete search history.

(56) References Cited

U.S. PATENT DOCUMENTS

| | | | | |
|---|---|---|---|---|
| 7,570,192 B2* | 8/2009 | Anthony et al. | ............ | 341/172 |
| 7,839,323 B2* | 11/2010 | Kidambi | ............ | 342/118 |
| 2008/0008679 A1* | 1/2008 | Kawai et al. | ............ | 424/78.31 |
| 2008/0253470 A1* | 10/2008 | Lee et al. | ............ | 375/260 |
| 2009/0174822 A1* | 7/2009 | Pugel | ............ | 348/731 |

OTHER PUBLICATIONS

"55: Physical Coding Sublayer (PCS), Physical Medium Attachment (PMA) Sublayer and Baseband Medium, Type 10GBASE-T," IEEE *p802.3an, Draft 4.0*, Draft Amendment to IEEE Std 802.3-2005, pp. 78-80, (2006).

"Data Over Cable Service Interface Specifications DOCSIS 3.0," Physical Layer Specification. CMS-SP-PHYv3.0-I05-070803, *CableLabs*, pp. 1-157, (Aug. 3, 2007).

Anderson, C., et al., "Enabling Tuner Technology for All-Digital Cable TV Networks," *Microtune White Paper: All-Digital Cable TV Networks*, pp. 1-8 (date not available).

Kenet, an EETimes "Silicon 60" Company, "Semiconductor Products That Deliver Ultra-High Performance with Extremely Low Power Consumption," Kenet's DOCSIS Broadband Digitizer, Aug. 2008.

Society of Cable Telecommunications Engineers. Engineering Committee—Digital Video Subcommittee. American National Standard, ANSI/SCTE 40 2004. Digital Cable Network Interface Standard, pp. 1-27 (2004).

Zancewicz, G., "Microtune," *Slides from the Consumer Electronics Show*, Jan. 7, 2005.

Zancewicz, G., et al., "Bandwidth: Key Weapon in the Cable-Telco Battle for Subscribers," *Microtune White Paper: Bandwidth*, pp. 1-7, (date not available).

* cited by examiner

*Primary Examiner* — Peguy Jean Pierre
(74) *Attorney, Agent, or Firm* — Hamilton, Brook, Smith & Reynolds, P.C.

(57) ABSTRACT

A cable gateway, such as compatible with version 3.0 of the Data Over Cable Service Interface Specifications and other audiovisual standards, that uses an analog front end having a charge-domain analog-to-digital converter that uses a charge-domain pipeline of at least two stages.

38 Claims, 12 Drawing Sheets

CABLE GATEWAY USING A CHARGE-DOMAIN PIPELINE ANALOG TO DIGITAL CONVERTER

RELATED APPLICATION

This application claims the benefit of U.S. Provisional Application No. 61/113,661, filed on Nov. 12, 2008. The entire teachings of the above application are incorporated herein by reference.

BACKGROUND OF THE INVENTION

Cable networks have been expanding beyond the basic delivery of television signals for which they were originally designed. Today they can carry data for internet and other communications as well as voice signals for the traditional telephone function. Competitive delivery of these services is requiring ever increasing data rates to the user.

At present, signals are transmitted over cable networks in the U.S. over a frequency band that spans about 1 GHz. Upstream traffic typically extends over a band from 5-85 MHz, whereas downstream traffic extends over a band that can range from 54-1002 MHz (the two bands may not overlap). The band is separated into channels that are 6 MHz wide.

Increased data rates are specified by just about every next-generation standard, including the Data Over Cable Service Interface Specifications (DOCSIS) 3.0 standard, the Society for Cable Telecommunications Engineers (SCTE) 40 standard, and the Comcast Residential Network Gateway (RNG) standard, all of which are incorporated herein by reference in their entireties. Although digital modulation increases the efficiency (and hence the data rate) of a given channel, the channel bandwidth places a fundamental limit on a given channel's information-carrying capacity. The only way to meet the new specifications is to increase the total bandwidth available for data transmission.

One way to increase the effective data rate is to aggregate, or bond, channels together. For example, bonding together four channels each operating at 40 Mbps yields an effective data rate of 160 Mbps. In addition to increasing demand for higher data rates, demand is also growing for having a greater number of video channels available at the customers' premises. With picture-in-picture, recording-while-viewing, and multiple simultaneous viewers watching different channels in a household, the number of simultaneous video channels required per household is increasing. Combined with the several channels required for data, the total number of simultaneous channels can reach 6-8 or higher in the future.

In conventional cable gateways, each channel is filtered, downconverted, and demodulated with a narrowband analog tuner. Because each channel requires its own tuner, however, cable gateways that use multiple tuners consume considerable power, dissipate that power as heat, and are therefore costly to operate.

SUMMARY OF THE INVENTION

A wideband cable apparatus comprises an analog front end coupled to a cable network to receive a signal, a charge-domain pipeline analog-to-digital converter (ADC) that digitizes the received signal, a digital tuner that separates the digitized signal into digitized channels, and a demodulator that extracts information from the digitized channels. The demodulator may operate according to data over cable service interface specifications (DOCSIS) provided by CableLabs, Inc., or other standard(s) in use by the cable operator. Some embodiments of the apparatus may be a cable gateway or cable modem. Embodiments of the present invention provide the user with many simultaneous channels for lower power and cost.

In some embodiments, the charge-domain pipeline ADC further comprises two or more bucket-brigade devices (BBDs), which may use boosted bucket-brigade charge transfer. In addition, the BBDs may use conditional charge addition in at least one stage. The BBDs may also have a stage where charge is conditionally added to either one but not both charge packets of a differential pair of charges.

In certain embodiments, the charge-domain pipeline ADC provides charge comparison against a reference charge in at least one stage. The charge-domain pipeline ADC may also be a differential charge pipeline using bucket-brigade charge transfer with charge comparison between differential charge-pairs in at least one stage. In other embodiments, the charge-domain pipeline is a differential charge-domain pipeline using bucket-brigade charge transfer having, in at least one stage, at least two charge comparisons with different thresholds between differential charge-pairs.

Some embodiments employ smaller capacitances in later pipeline stages than in earlier pipeline stages. In other embodiments, the maximum output charge is reduced in later pipeline stages compared to earlier stages. Embodiments of the cable modem also include charge-transfer circuits that provide control of the charge-transfer direction.

The charge-domain pipeline ADC may implement a Redundant Signed Digit (RSD) analog-to-digital conversion algorithm and binary stage scaling.

In some embodiments, the charge-domain ADC further includes a first charge-transfer circuit, a second charge-transfer circuit, a node coupled to the first charge-transfer circuit and the second charge-transfer circuit, a capacitor coupled to the node and to a clocked voltage, a switched voltage coupled to the node, and at least one of the first or second charge transfer circuits being a boosted charge-transfer circuit. The control circuitry may be configured to provide independent control of charge storage, charge-transfer timing, and charge-transfer direction between the first charge-transfer circuit and the second charge-transfer circuit.

Other embodiments also include a second capacitor coupled to the node and to a conditional voltage, where the second capacitor is configured to provide conditional charge to the node. For example, the second capacitor may provide conditional charge to the node based on a comparison of the voltage of the node with a reference voltage. Further embodiments include a plurality of capacitors coupled to the node and to conditional voltages, where each of the plurality of capacitors is configured to provide conditional charge to the node.

Embodiments arranged to provide a differential charge-domain pipeline include a third charge-transfer circuit, a fourth charge-transfer circuit, and a second node coupled to the third charge-transfer circuit and the fourth charge-transfer circuit. A second capacitor is coupled to the node and to a second clocked voltage; a third and fourth capacitor are coupled respectively to the first node and second node to provide conditional charge to either the first charge-transfer circuit or the third charge-transfer circuit.

In further embodiments, at least one of the third charge-transfer circuit or the fourth charge-transfer circuit is a boosted charge-transfer circuit. The third capacitor may provide conditional charge based on a comparison of the voltages of the first node and the second node. Yet other embodiments include a plurality of conditional charge capacitors coupled to the first and second nodes, where the capacitors are configured to provide conditional charge to either the first charge-transfer circuit or the third charge-transfer circuit. For example, the capacitors may provide conditional charge based on comparisons of the voltages of the first node and the second node at different thresholds.

Example embodiments also include a cable apparatus comprising an analog front end, connected to receive an input signal, and a charge-domain pipeline ADC using bucket-brigade charge transfer, coupled to receive the input signal. The charge-domain pipeline ADC includes a first charge-transfer circuit, a second charge-transfer circuit; and a node coupled to the first charge-transfer circuit and the second charge-transfer circuit. A first clocked capacitor is coupled to the node and to a clocked voltage. In addition, conditional charge capacitors are coupled to the node and to conditional voltages, where each of the conditional charge capacitors is configured to provide conditional charge to the node.

Further embodiments also include a third charge-transfer circuit, a fourth charge-transfer circuit, and a second node coupled to the third charge-transfer circuit and the fourth charge-transfer circuit. In these embodiments, a second capacitor is coupled to the node and to a second clocked voltage. Similarly, a second set of conditional charge capacitors is coupled to the first node and second node. The second set of conditional charge capacitors is configured to provide conditional charge to either the first charge-transfer circuit or the third charge-transfer circuit based on comparisons of the voltages of the first node and the second node at different thresholds.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows. The teachings of all patents, published applications, and references cited herein are incorporated by reference in their entirety.

Data Over Cable and Cable Gateways

Figure 1:
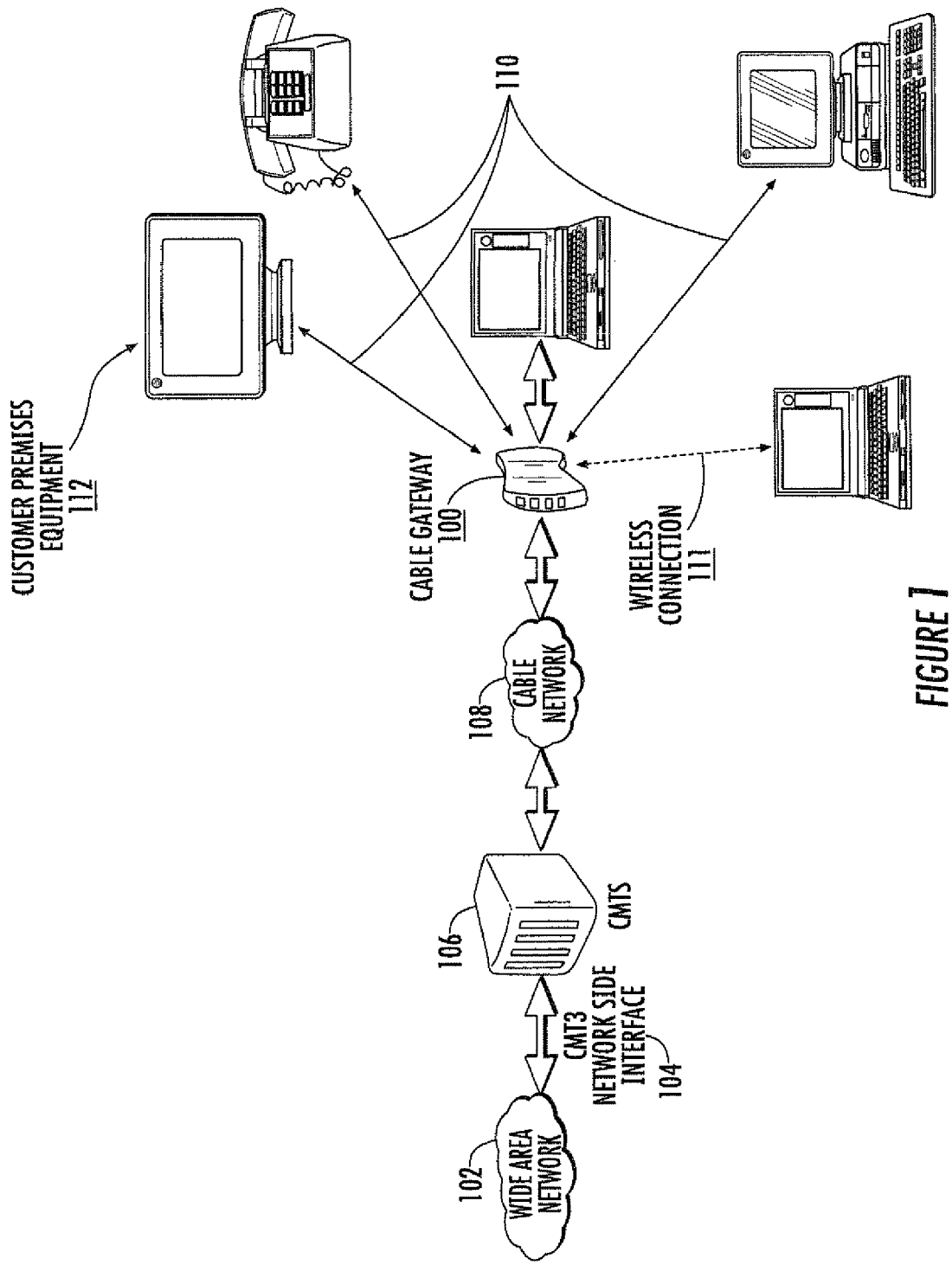
FIG. 1 is a schematic diagram of an example data-over-cable system.

FIG. 1 shows a cable gateway 100 operating in a cable network 108. A wide-area network 102 connects to a cable modem termination system (CMTS) 106 via a CMTS network-side interface 104. The CMTS 106 allows cable operators to transmit high-speed data from the wide-area network 102 via the cable network 108, which may be a coaxial, optical fiber, or hybrid fiber/coaxial cable television (CATV) network. The cable network 108 connects, in turn, to the cable gateway 100, which transmits data to and receives data from customer premises equipment 112 via one or more interfaces 110. Typically, customer premises equipment 112 includes computers, televisions, and telephones. FIG. 1 shows a cable gateway 100 that routes signals to customer premises equipment 112, including an audio/video system, a telephone, and several computers. The cable gateway 100 disclosed herein can be configured to operate according to any suitable specification for transmitting and receiving data, including DOCSIS 3.0, Comcast RNG, SCTE 40, T3/S10 ATSC, and OpenCable specifications.

As noted above, next-generation specifications require cable modems and cable gateways to tune multiple 6 MHz channels for receiving television, voice, and data signals. (For example, DOCSIS 3.0 specifies the ability to independently tune at least four channels.) The ability to tune multiple channels is necessary to watch different television channels on different televisions. Recording video signals, such as with a digital video recorder, and displaying multiple video signals on a single television, as with picture-in-picture displays, also requires the ability to tune multiple channels independently. Similarly, transmitting and receiving data signals, such as Internet Protocol traffic, can require multiple channels to achieve the necessary data rates.

Unlike conventional cable gateways, the cable gateway 100 shown in FIG. 1 uses a wideband charge-domain pipeline analog-to-digital converter (ADC) to digitize signals received from the cable network 108. The output from the wideband ADC can be tuned digitally, rather than with analog tuners, resulting in lower power consumption compared to alternative methods. In one embodiment, the cable gateway 100 uses a 12-bit, 2.5 Giga Samples per second (Gsps) ADC that consumes under 1.5 W. With this performance, the cable gateway 100 digitizes the entire 1 GHz band, making it possible to process video channels, data channels, and voice over IP (VoIP) channels with digital tuners. In this implementation, a single ADC used with digital tuning can supply up to 150 simultaneous channels.

Because the wideband ADC is a charge-domain device, it can be fabricated using standard complementary metal-oxide-semiconductor (CMOS) techniques. A single ADC forms a semiconductor intellectual property (IP) block that can be replicated many times on a single chip. In some embodiments, the wideband ADC can be integrated with other components, such as processors, memory, digital tuners, digital demodulators, or similar devices, on a single silicon chip. In addition, the wideband ADC can be integrated onto a single chip with suitable clocks and error correction, including offset, gain, and timing correction.

Figure 2A:
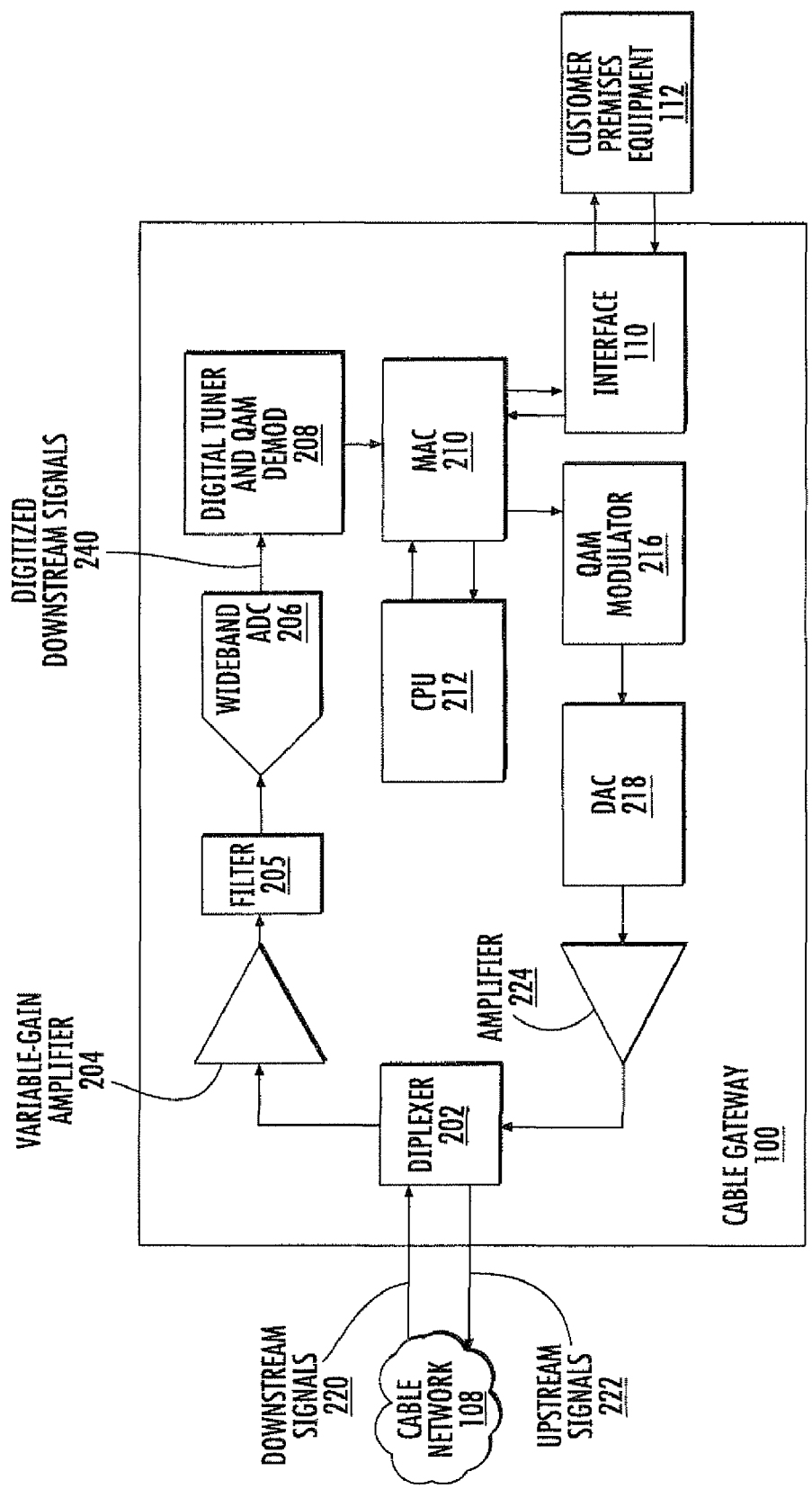
FIG. 2A is a schematic diagram of a cable gateway.

FIG. 2A is a high-level block diagram of an example cable gateway 100. Signals transmitted to and from the CMTS 106 are first coupled to the cable gateway 100 at a diplexer 202, which separates downstream signals 220 from upstream signals 222. In general, CATV networks are asymmetric networks: the bandwidth dedicated to the downstream signals 220 is greater than the bandwidth dedicated to the upstream signals 222. In networks compliant with DOCSIS 3.0, the downstream signals 220 occupy a passband with a lower edge at either 54 or 108 MHz and an upper edge in the range of 300-1002 MHz, depending on the implementation. Upstream signals 222 typically have passbands of 5-30 MHz, 5-42 MHz, or 5-85 MHz.

The diplexer 202 directs downstream signals to a variable-gain amplifier (VGA) 204, which amplifies the received signal before transmitting it through a filter 205 to a wideband ADC 206. The wideband ADC 206 digitizes the received signal, then passes the digitized downstream signals 240 to a digital tuner and quadrature-amplitude-modulation (QAM) demodulator 208. (Alternative embodiments may use other suitable modulation schemes.) In some embodiments, the digital tuner and QAM demodulator 208 tunes and demodulates the amplified, filtered, and digitized downstream signals 240 in accordance with either 64-QAM or 256-QAM techniques to recover the underlying information.

Figure 2B:
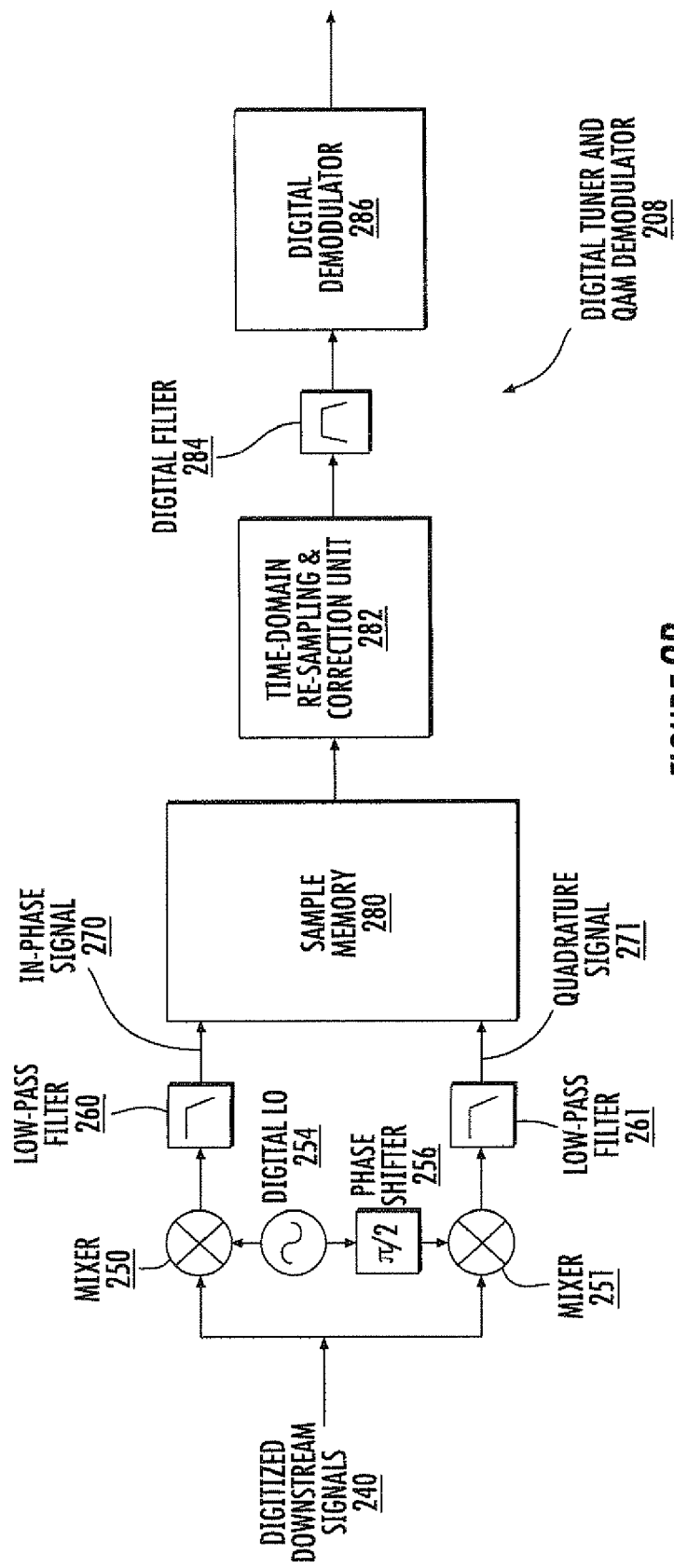
FIG. 2B is a schematic diagram of a digital tuner and Quadrature Amplitude Modulation (QAM) demodulator.

FIG. 2B shows a digital tuner and QAM demodulator 208 according to one embodiment. Digitized downstream signals 240 are directed to first and second mixers 250 and 251. The first mixer 250 beats the digitized downstream signals 240 against a signal from a digital local oscillator (LO) 254 to produces a baseband signal that is filtered by a low-pass filter 260, producing an in-phase signal 270. The second mixer 251 beats the digitized downstream signals 240 against a signal from the digital LO 254 that is shifted in phase by 90° by a phase shifter 256. A low-pass filter 261 filters the mixer output to produce a quadrature signal 271.

A sample memory 280 stores time-domain versions of the in-phase signal 270 and the quadrature signal 271. The signals 270, 271 are re-sampled and corrected with a time-domain re-sampling and correction unit 282 before being filtered with a digital filter 284 and demodulated with a digital demodulator 286.

As shown in FIGS. 2A and 2B, the wideband ADC 206 enables a tuning and demodulation architecture that is more efficient and fundamentally different than the architectures of gateways that use analog tuners. The specifics of the digital tuning and demodulation (e.g., channel center frequency, channel bandwidth, number of channels, noise margin, etc.) depend on the particular cable gateway/modem standard implementation, as will be understood by those skilled in the art.

Referring again to FIG. 2A, a media access controller (MAC) 210 and a central processing unit (CPU) 212 process the demodulated downstream signals 222 from the digital tuner and QAM demodulator. In example embodiments, the MAC 210 is an open system interconnection (OSI) layer-2 element that frames the data into Internet Protocol (IP) packets or frames according to DOCSIS 3.0. (All DOCSIS-compatible devices are expected to be backwards compatible, meaning that embodiments compatible with DOCSIS 3.0 are necessarily compatible with earlier DOCSIS standards.) The MAC may also route encoded video and audio signals to customer-premises equipment. The functions of the MAC 210 may be implemented in hardware, software, or a combination of the two. Software implementations may be stored in read-only memory or random-access memory (not shown) and executed by the CPU 212.

The MAC 210 transmits packets and frames to customer-premises equipment 112 via an interface 110. Customer premises equipment 112 may be a telephone, a television, and/or a computer. In various embodiments, the interface 110 may be a universal serial bus (USB) interface, an IEEE 1394 interface, or any other suitable interface.

In addition to receiving processed downstream traffic 220, customer premises equipment 112 may also transmit data through the upstream channel 222 of the cable network 108 via the cable modem 100. The interface 110 transmits data from customer premises equipment 112 to the MAC 210, which formats the data, then sends it to a QAM modulator 216. Again, alternative embodiments may use other modulation schemes.

A digital-to-analog converter (DAC) 216 converts the modulated digital signals into an analog output, which is amplified by an amplifier 224. The diplexer 202 directs the output of the amplifier 220 to the cable network 108 over the upstream channel 222. In certain embodiments, the QAM modulator 216, the DAC 218, and the amplifier 224 typically operate over lower bandwidths than the QAM demodulator 208, the wideband ADC 206, and the VGA 204.

Wideband ADCs

Figure 3:
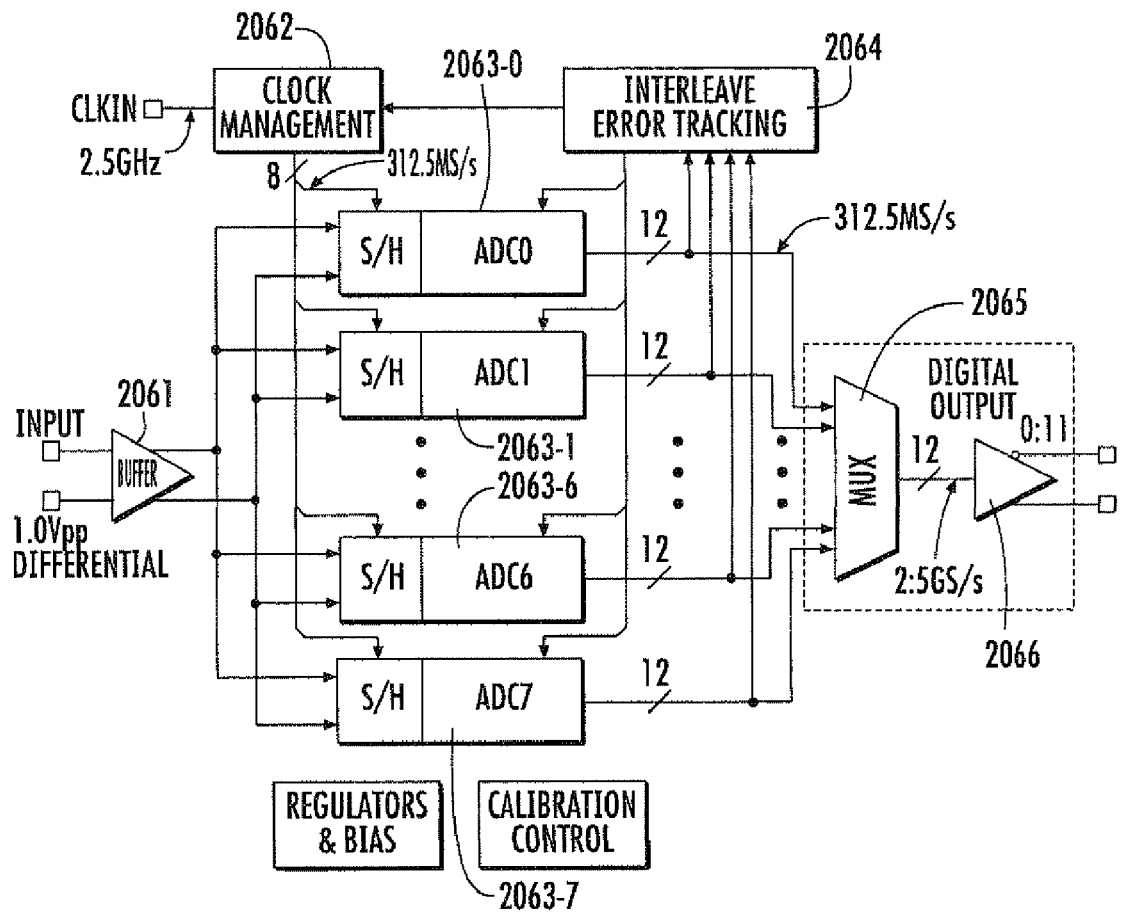
FIG. 3 is a schematic diagram of a wideband analog-to-digital converter (ADC).

FIG. 3 is a block diagram of an example embodiment of a wideband ADC 206, which uses a parallel array of time-interleaved subunit ADCs, labeled ADC 0-8. Although eight subunit ADCs are shown in FIG. 3, the ADC 206 may include fewer or more subunit ADCs. In a preferred embodiment, the subunit ADCs are charge-domain ADCs such as those disclosed in a previous patent application by one of the same inventors (Michael P. Anthony, U.S. patent application Ser. No. 11/807,914, filed May 30, 2007, entitled "Boosted Charge Transfer Circuit"), which is incorporated by reference in its entirety.

The wideband ADC 206 operates at a high frequency conversion rate by sampling an input signal s(t) at a sampling rate $f_s$ (and corresponding sampling period $T=1/f_s$). In some embodiments, an internal clock circuit may supply the clock signal $f_s$; in other embodiments, an external clock circuit may supply the clock signal $f_s$ via a clock input 340. A clock management unit 336 handles synchronization of and distribution of the clock signal to the subunit ADCs.

In FIG. 3, the source impedance of the input signal is reduced by the Buffer 2061 to a low value appropriate for driving the parallel inputs of the given number of subunit ADCs. In the preferred embodiment an externally supplied clock runs at approximately 2.5 GHz. Via a Clock Management block 2062, each of 8 subunit ADCs 2063-0 through 2063-7 are triggered sequentially to sample the signal at their input at a sample rate of approximately 312.5 MHz. The samples are interleaved in time to provide an aggregate sample rate equal to the clock rate. This interleaving architecture allows the subunit ADCs 2063-0-7 to operate at relatively lower speed, giving them more time to convert the signal with higher accuracy. It is important that the subunit ADCs 2063-0-7 be well matched to avoid generation of spurious signals. To accomplish this, their digital outputs are monitored by Interleave Error Tracking block 2064, which calculates any matching error and adjusts the timing of the subunit ADC's their offset and/or gain to minimize the error. The outputs of the subunit ADCs may be multiplexed together by a MUX 2065 and then passed to the next digital-processing block via a driver 2066 as a single serial data stream. The subunit ADC outputs may also be handled individually as a parallel output stream if that format is more appropriate for the following digital processing.

Subunit ADCs

Figure 4:
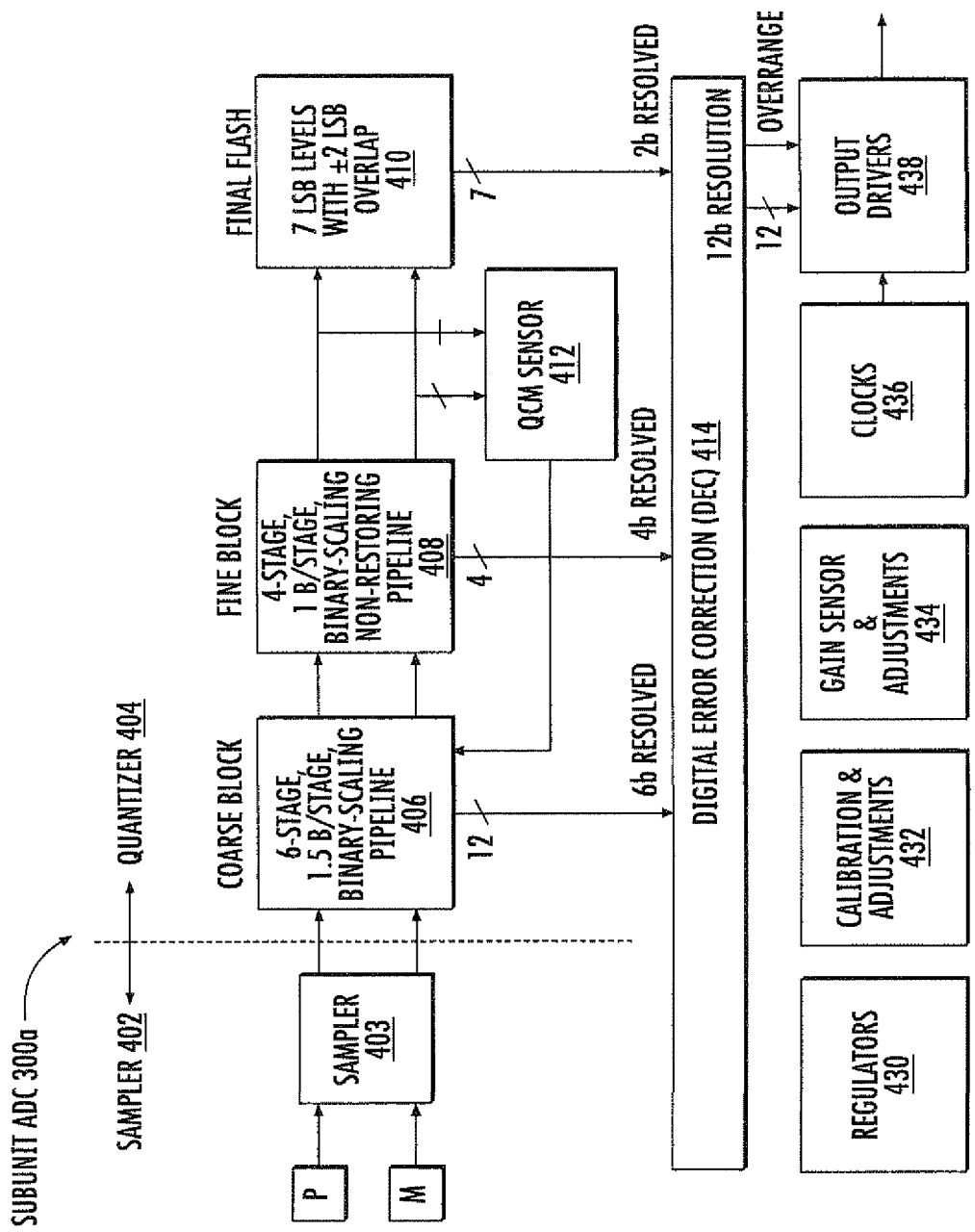
FIG. 4 is a block diagram of a subunit ADC that uses, at least in part, a charge pipeline, successive-approximation type circuit with the invention.

FIG. 4 is a more detailed view of a preferred embodiment of one of the successive approximation pipeline ADC subunits 300a-d. FIG. 4 illustrates a twelve (12) bit converter, although it will be understood that converters of other resolutions are possible.

The illustrated ADC 300a is a differential pipeline having a plus (P) charge signal path and a minus (M) charge signal path.

The ADC's functions can be generally categorized as a sampler 402 and a quantizer 404. The sampler 402 includes a input sampler circuit 403. The quantizer 404 includes a coarse block 406 (providing 6 resolved bits), fine block 408 (providing 4 resolved bits), and final flash 410 (providing the final 2 resolved bits). The quantizer also includes supporting circuitry, such as a common-mode charge (QCM) sensor 412, Digital Error Correction (DEC) 414 as well as regulators 430, calibration and adjustment circuits 432, gain sensor and adjustment circuits 434, clock circuits 436, and output drivers 438.

According to aspects of a preferred embodiment, the coarse block 406 is made up of six (6) pipelined stages, each stage providing one-and-a-half bits per stage. The fine block 408 makes use of four (4) stages of a one bit per stage pipeline. The final flash 410 provides seven least significant bit (LSB) levels using known flash converter techniques to provide the final 2 bits to the DEC circuit 414, which combines these with bits from the previous stages 406, 408 to provide the 12-bit output of this converter.

This embodiment thus applies coarse block 406 and fine block 408 pipeline stage designs to novel advantage. Before discussing these designs in detail, some understanding of charge-domain signal-processing circuits is helpful. In such circuits, signals are represented as charge packets. These charge packets are stored, transferred from one storage location to another, and otherwise processed to carry out specific signal-processing functions. Charge packets are capable of representing analog quantities, with the charge-packet size in coulombs being proportional to the signal resented. Charge-domain operations such as charge-transfer are driven by 'clock' voltages, providing discrete-time processing. Thus, charge-domain circuits provide analog, discrete-time signal-processing capability. This capability is well-suited to performing analog-to-digital conversion using pipeline algorithms.

Charge-domain circuits are implemented as charge-coupled devices (CCDs), as metal-oxide-semiconductor (MOS) bucket-brigade devices (BBDs), and as bipolar BBDs. In a preferred embodiment, MOS BBDs are used to implement the pipelined ADC stages. These pipelined ADCs stage implement a successive-approximation analog-to-digital (A/D) conversion algorithm, in which progressively refined estimates of an input signal are made at sequential times. In the pipelined version of this algorithm, one or several bits are resolved at each pipeline stage, the quantized estimate is subtracted from the signal, and the residue is propagated to the next pipeline stage for further processing.

A commonly used variation of the basic successive-approximation algorithm is the Redundant Signed Digit (RSD) algorithm, in which the resolution of each stage is finer than the stage's nominal bit-weight. The RSD algorithm provides intrinsic digital code redundancy, which makes possible the relaxing of precision requirements on the comparators at each stage.

Charge-domain pipelined ADC stages have the advantage of not requiring op-amps as essential components of the pipeline. Instead, they transfer charge packets directly from each pipeline stage to the next with essentially unity charge gain.

Prior-art charge-domain pipelined ADCs have been limited in accuracy or operating speed by various architectural deficiencies. BBD-based ADCs have suffered from non-linearity and other inaccuracies due to the imprecise nature of BBD charge transfer between pipeline stages. CCD-based implementations have suffered from excess power consumption due to the requirement of driving numerous CCD gates with high-speed clock signals.

The preferred implementation provides an improved ADC for use in a cable modem interface using MOS BBDs. This implementation achieves lower power consumption and improved resolution compared to other charge-domain methods by the use of a tapered pipeline, in which the amount of charge being processed is reduced in later pipeline stages compared to earlier ones. In one embodiment, it provides high-speed and high-accuracy (A/D) conversion by employing an improvement on conventional BBDs known as a "boosted" charge-transfer circuit.

Bucket-Brigade Device (BBD) Pipelines

MOS BBD pipelines are conventionally implemented using common-gate field-effect transistors (FETs) as the charge-transfer devices, which convey charge from one pipeline stage to the next. In the aforementioned patent application (U.S. patent application Ser. No. 11/807,914, filed May 30, 2007 entitled "Boosted Charge Transfer Circuit"), an improved class of charge-transfer circuits is disclosed and explained in detail. The ADC of the present invention can be implemented using either conventional or boosted charge-transfer circuits; the preferred embodiment employs the boosted charge-transfer circuit, which provides higher operating speed and accuracy. In the following discussion and figures, charge-transfer circuits are represented abstractly and some behavioral aspects of these circuits are mentioned, but no details of the operation of such circuits are provided.

In the following description, all circuits are discussed assuming electrons as the signal-charge carriers and NFETs for signal-charge transfer. Identical circuits can be applied equally well using holes as charge carriers, by employing PFETs and reversed signal and control voltage polarities.

Figure 5:
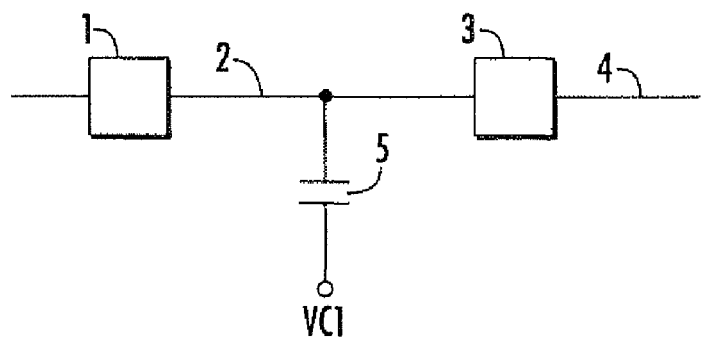
FIG. 5 shows a simplified circuit diagram of a bucket-brigade device (BBD) charge-pipeline stage.

The basic principle of a BBD pipeline of the general type employed in this invention is described with the aid of FIG. 5, which depicts a single stage of such a pipeline. In this stage charge is stored on capacitor 5, which is connected between storage node 2 and voltage $V_{C1}$. Charge enters the stage via charge-transfer circuit 1, and later exits the stage via charge-transfer circuit 3. Voltage $V_{C1}$ is a digital clock signal which controls the timing of charge processing in the stage. Other digital clock signals, not shown, may be used to control the activity of the charge-transfer circuits.

Figure 6:
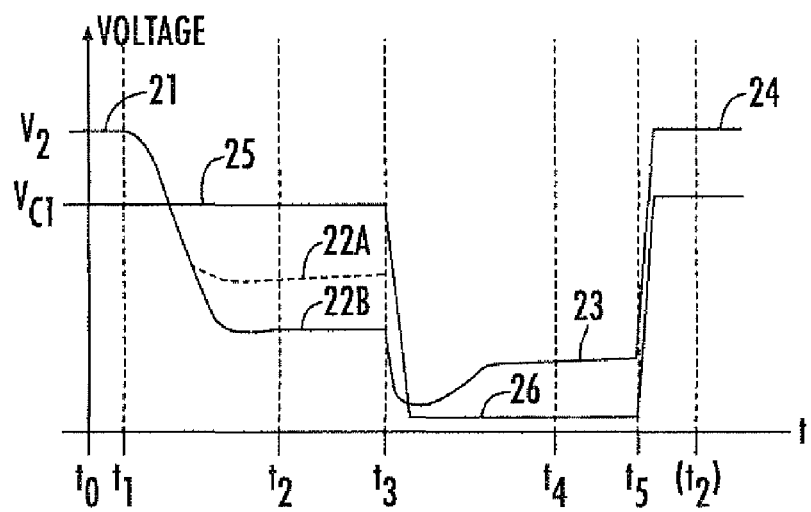
FIG. 6 illustrates voltage waveforms associated with FIG. 5.

Operating waveforms of the pipeline stage are shown in FIG. 6. At time $t_0$ clock voltage $V_{C1}$ has a positive value 25. $V_2$, the voltage of storage-node 2 in FIG. 5, is also at a high initial voltage 21. At $t_1$ negative charge begins to be transferred from the previous stage (to the left of FIG. 5) via charge-transfer circuit 1 into the stage shown. As this negative charge accumulates on capacitor 5, $V_2$ falls to a more negative value. The voltage of node 2 settles to a relatively high value 22A if a relatively small negative charge was transferred; with a larger charge transferred, node 2 settles to a more negative voltage 22B. At time $t_2$ charge transfer into the stage is complete. The voltage of node 2 is related to the charge by the well-known expression Q=CV, where is the total capacitance of node 2. In FIG. 5, C is comprised of $C_5$, the capacitance of capacitor 5, plus any parasitic capacitance of node 2; such parasitic capacitance is usually small and is neglected in this discussion.

Charge transfer out of the stage begins at time $t_3$ when clock voltage $V_{C1}$ switches to a low state. Capacitor 5 couples this voltage transition to node 2, driving $V_2$ low as well. Charge-transfer circuit 3 absorbs charge from capacitor 5, limiting the negative excursion of node 2, and eventually causing node 2 to settle to voltage 23 at $t_4$. Voltage 23 is a characteristic of charge-transfer circuit 3, and is independent of the amount of charge which had been stored on node 2. Charge-transfer circuit 3 transfers the charge absorbed from capacitor 5 to node 4 which is part of the stage following the one shown. After $t_4$ charge transfer is complete.

Finally, at time $t_5$, clock voltage $V_{C1}$ returns to its initial state (voltage 25). Its positive-going transition is coupled to node 2 by capacitor 5, raising node 2 to voltage 24. Neglecting parasitic capacitance, no charge flows onto or off of node 2 during this transition; the voltage change of $V_2$ is therefore equal to the voltage change of $V_{C1}$ during the transition at $t_5$. Since $V_2$'s value at the start of this transition, voltage 23, is independent of charge processed, voltage 24 is likewise independent of charge processed. This transition completes the operating cycle; the resulting voltage 24 at node 2 is thus the initial voltage for the next cycle. Thus the initial voltage state of the stage is constant cycle-to-cycle, and voltage 21=voltage 24. Consequently the initial and final charge on node 2 are also equal, and the charge transferred out is equal to the charge transferred in.

In summary: charge is transferred into the stage shown in FIG. 5 during $t_1$-$t_2$; between times $t_2$ and $t_3$ it is temporarily stored on capacitor 5, and is manifested as the value of $V_2$; during times $t_3$-$t_4$ this charge is completely transferred to the next stage; at $t_5$ the stage returns to its initial state, ready again to receive incoming charge. Thus the basic stage shown acts as a shift register for analog charge packets.

It should be understood that practical circuits depart in many details from this idealized description. Such departures include non-zero parasitic capacitance and imperfect charge transfer, for example. These effects, however, do not change the basic operating principles described above; and these principles can be applied in practical circuits with sufficient accuracy for useful purposes.

Conventional BBD charge pipelines have generally employed simple two-phase digital clock signals which simultaneously controlled the charge-storage capacitors and the charge-transfer FETs. Pipeline circuits such as that of FIG. 5 and others described below also operate using a two-phase clocking system. In these circuits, however, it is desirable to provide independent control of the activity of the charge-transfer circuits and of other clocked events in the stage such as capacitor switching. For this reason, the circuits of the present invention employ additional clock signals which control charge-transfer circuit activity. These signals and their function will be explained with the aid of FIGS. 7 and 8.

Figure 7:
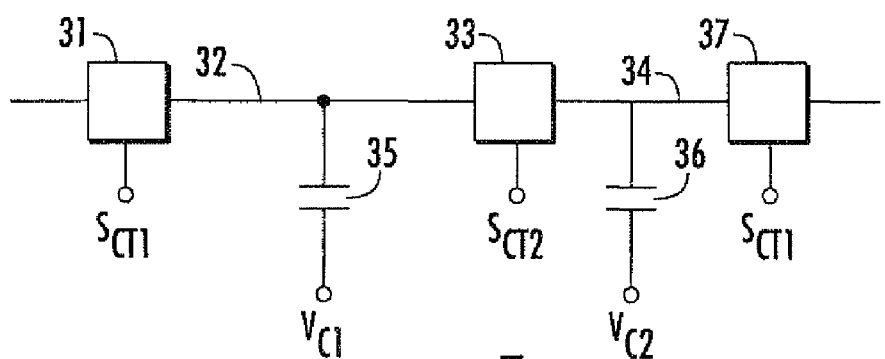
FIG. 7 shows a two-stage BBD charge pipeline.

FIG. 7 shows a pipeline segment containing two successive stages, each like the basic pipeline stage of FIG. 5. This pipeline segment consists of first charge-transfer circuit 31, first storage node 32, and first capacitor 35, together constituting the first pipeline stage; second charge-transfer circuit 33, second storage node 34, and second capacitor 36, together constituting the second pipeline stage; and third charge-transfer circuit 37, which is the entry point of a next pipeline stage which is not shown. Clock voltages $V_{C1}$ and $V_{C2}$ drive the two capacitors respectively; and digital clock signals $S_{CT1}$ and $S_{CT2}$ control the charge-transfer circuits.

Figure 8:
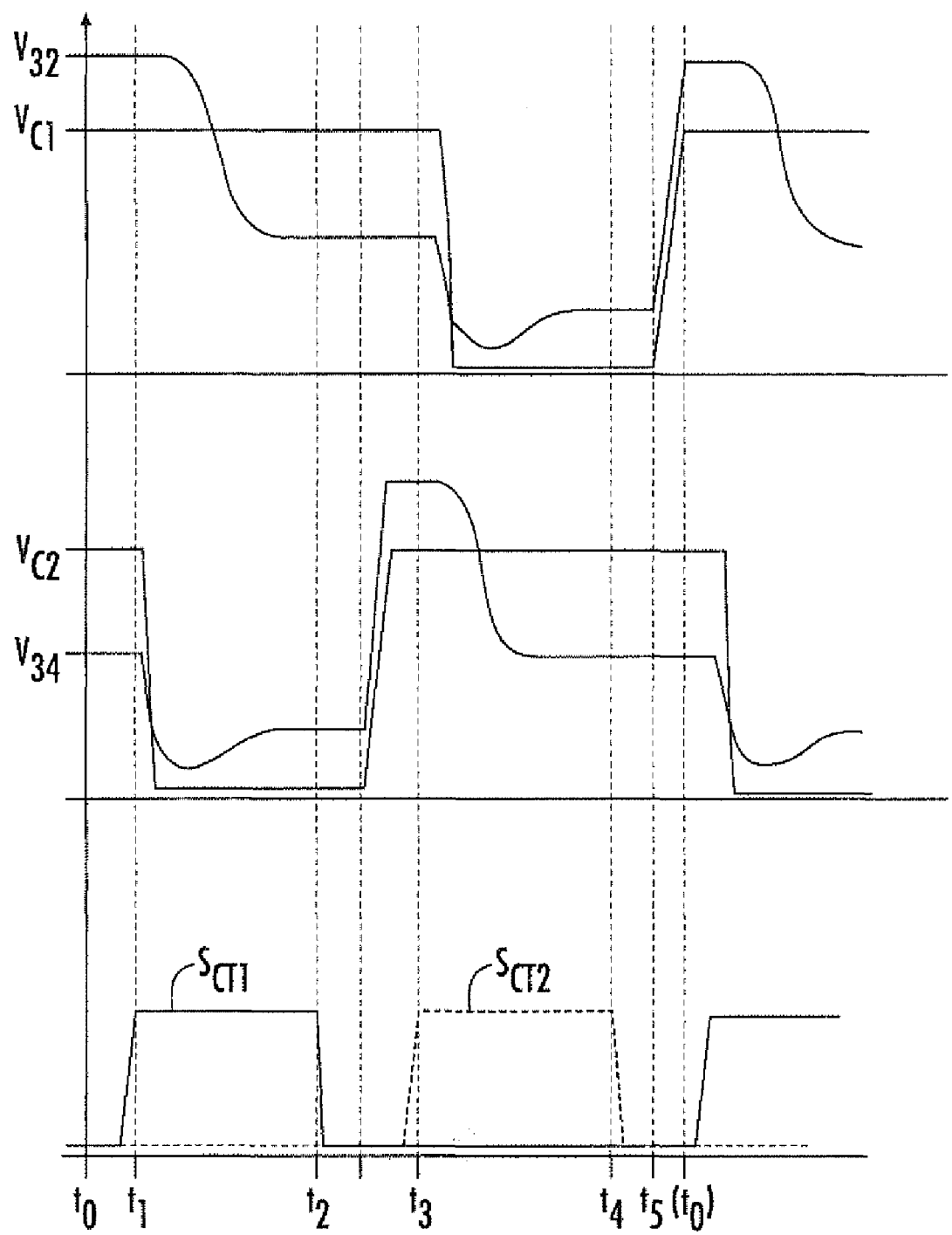
FIG. 8 illustrates voltage waveforms associated with FIG. 7.

The waveforms associated with the operation of the circuit of FIG. 7 are shown in FIG. 8. The waveforms pertaining to the first stage in FIG. 7, $V_{32}$ and $V_{C1}$, are identical with those of $V_2$ and $V_{C1}$ respectively in FIG. 6. The waveforms pertaining to the second stage in FIG. 7, $V_{34}$ and $V_{C2}$, are similar, but shifted by one-half of the clock cycle from those of the first stage. Thus the two stages of FIG. 7 operate on alternate half-cycles of the complete clock cycle. During the first half-cycle shown, when charge is transferring via charge-transfer circuit 31 into the first stage in FIG. 7, charge is transferring via charge-transfer circuit 37 out of the second stage (into the next stage, not shown). Likewise, during the second half-cycle, while charge is transferring out of the first stage via charge-transfer circuit 33, it is being transferred into the second stage.

In order to control the direction of charge transfer, it is necessary to selectively enable the appropriate charge-transfer circuits. The digital signals $S_{CT1}$ and $S_{CT2}$ provide this control. As shown in FIG. 8, $S_{CT1}$ is asserted (high) during the interval $t_1$-$t_2$. This control signal enables charge-transfer circuits 31 and 37, which are active during this interval as described above. During the corresponding interval in the second half-cycle, $t_3$-$t_4$, $S_{CT2}$ is asserted, enabling charge-transfer circuit 33. The exact means by which the digital signals $S_{CT1}$ and $S_{CT2}$ act to control the activity of the charge-transfer circuits is not pertinent to this invention. Some examples of such control are described in the aforementioned patent application incorporated by reference herein, (U.S. patent application Ser. No. 11/807,914, filed May 30, 2007 entitled "Boosted Charge Transfer Circuit").

The two-phase operating mode just described is used in all of the pipeline circuits described below, together with control (by signals equivalent to $S_{CT1}$ and $S_{CT2}$) of the charge-transfer circuits. In the interest of clarity, these details are not repeated in subsequent figures or descriptions.

In order to form a charge-domain ADC from a pipeline composed of stages similar to FIG. 5, a minimum of two operations in addition to charge storage and shifting are required: charges must be compared to a reference value, typically another charge; and a reference charge must be conditionally added to the signal charge (this 'addition' may be of either sign). In the ADC of this invention, these two operations are carried out in each of several pipeline stages. Implementation of these operations is explained below, beginning with the conditional addition of charge.

Figure 9:
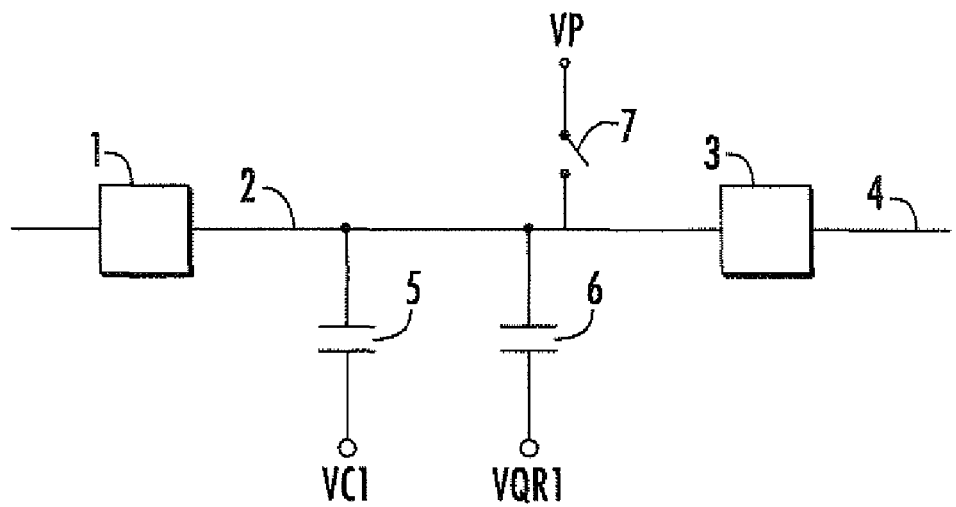
FIG. 9 shows a BBD charge-pipeline stage including conditional charge addition.
Figure 10:
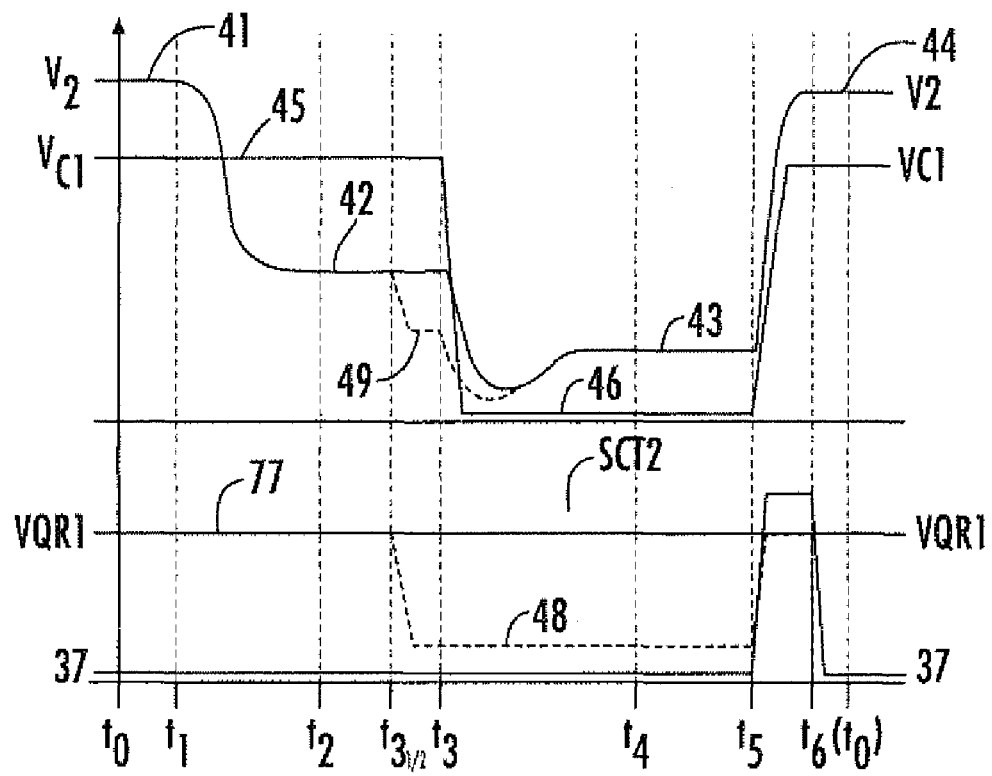
FIG. 10 illustrates voltage waveforms associated with FIG. 9.

The basic principle employed for conditional charge addition is depicted in FIG. 9, with operating waveforms shown in FIG. 10. For the purposes of this discussion, a single-ended stage is shown. In practical ADC designs, differential operation is usually preferred; both modes are possible within the scope of this invention.

The pipeline stage shown in FIG. 9 retains all the elements shown in FIG. 5. In addition, FIG. 9 includes two new elements: capacitor 6 (with value $C_6$) connected between charge-storage node 2 and voltage $V_{QR1}$; and switch 7 connected between node 2 and voltage $V_P$. Switch 7 is controlled by a periodic digital clock signal (identified as $S_7$ in FIG. 6).

FIG. 10 shows the operating waveforms of the circuit of FIG. 9. The initial conditions in FIG. 10 are similar to those in FIG. 6: $V_{C1}$ is at high voltage 45 and $V_2$, the voltage of node 2, is at high voltage 41. In addition, $V_{QR1}$ is at high voltage 47, and switch 7 is in an off state, indicated by the low value of its control signal $S_7$ in FIG. 10. As in FIG. 6, charge is transferred into the stage between $t_1$ and $t_2$, causing $V_2$ to fall in proportion to the incoming charge, settling at voltage 42. The change in $V_2$ due to incoming charge is inversely proportional to the total capacitance of node 2 as explained above. In FIG. 9 (neglecting parasitic capacitance) this total capacitance is $C=C_5+C_6$.

After the charge is transferred in, the new features of FIG. 9 come into play. At time $t_{3A}$ voltage $V_{QR1}$ conditionally switches from its high state 47 to low state 48. This conditional transition of $V_{QR1}$ is coupled via $C_6$ to node 2 where, because of capacitive division, it produces a similar but smaller voltage change. The voltage at node 2 changes to voltage 49 (dashed line) if $V_{QR1}$ switches, and remains at voltage 42 (solid line) if it does not.

At time $t_3$, $V_{C1}$ switches from high voltage 45 to low voltage 46, instigating charge transfer out of the stage. As explained with reference to FIG. 6, node 2 is driven to a lower voltage due to coupling via capacitor 5. Charge-transfer circuit 3 removes charge from node 2 and transfers it to the next stage. By $t_4$ $V_2$ settles to voltage 43 which is independent of the charge previously on node 2, and charge transfer out of the stage is complete.

At $t_5$ both $V_{C1}$ and $V_{QR1}$ return to their initial high states (voltages 45 and 47 respectively). This transition is identical for $V_{C1}$ in every clock cycle. $V_{QR1}$, however, may already be at its high voltage 47, depending on whether or not it switched at $t_{3A}$. Thus the positive step coupled to node 2 at $t_5$ can have different values, depending on the state of $V_{QR1}$, resulting in a different final voltage. The added switch 7 in FIG. 9 is used to restore the voltage (and charge) on node 2 to a repeatable state regardless of the state of $V_{QR1}$ at $t_5$. Switch 7 is turned on, as indicated by the high state of its control signal S7, during $t_5$-$t_6$, thus establishing a repeatable voltage at node 2 to begin the next cycle, so voltage 44=voltage 41. With an ideal switch, voltage 44=$V_P$; practical MOS switches introduce a small 'pedestal' so that voltage 44≠$V_P$. This non-ideality is, however, repeatable cycle-to-cycle, so the voltage 44=voltage 41 condition is still met in practical circuits.

Unlike the case of FIG. 5 where the charge transferred into the stage was subsequently transferred out without alteration, the outgoing charge in the circuit of FIG. 9 differs in general from the incoming charge:

$$Q_{OUT}=Q_{IN}+C_6\Delta V_{QR1}+Q_{CONST} \quad \text{Equation 1}$$

where $C_6$ is the capacitance of capacitor 6, $\Delta V_{QR1}$ is the change in $V_{QR1}$ at $t_{3A}$, and $Q_{CONST}$ is a fixed charge which depends on $V_P$, voltages 43, 45, and 46, and the capacitor values. As is apparent in FIG. 10, $\Delta V_{QR1}$ is equal to (voltage 48−voltage 47) if $V_{QR1}$ switches, and is equal to zero if it does not. Note that both $C_6\Delta V_{QR1}$ and $Q_{CONST}$ can be either positive or negative quantities.

When the circuit of FIG. 9 is used to form one stage of a pipelined ADC, the quantity (voltage 48−voltage 47) is made equal to a reference voltage; for convenience it will be called $V_{R1}$. Correspondingly, the quantity $C_6 V_{R1}$ becomes a reference charge, since $C_6$ is fixed in a given instantiation. Thus the conditional choice of $\Delta V_{QR1}=V_{R1}$ or $\Delta V_{QR1}=0$ at $t_{3A}$ corresponds in Equation 1 to the conditional addition of a reference charge $C_6 V_{R1}$ to the incoming charge packet $Q_{IN}$. The circuit of FIG. 9 thus provides one of the two operations required for charge-domain ADC implementation.

Note that the exact position of time $t_{3A}$ is not critical to the operation of the circuit of FIG. 9. The conditional transition of $V_{QR1}$ can occur at any time between $t_0$ and $t_3$ with no change in circuit performance; under some practicable conditions it may also occur in the $t_3$-$t_4$ interval.

Figure 11:
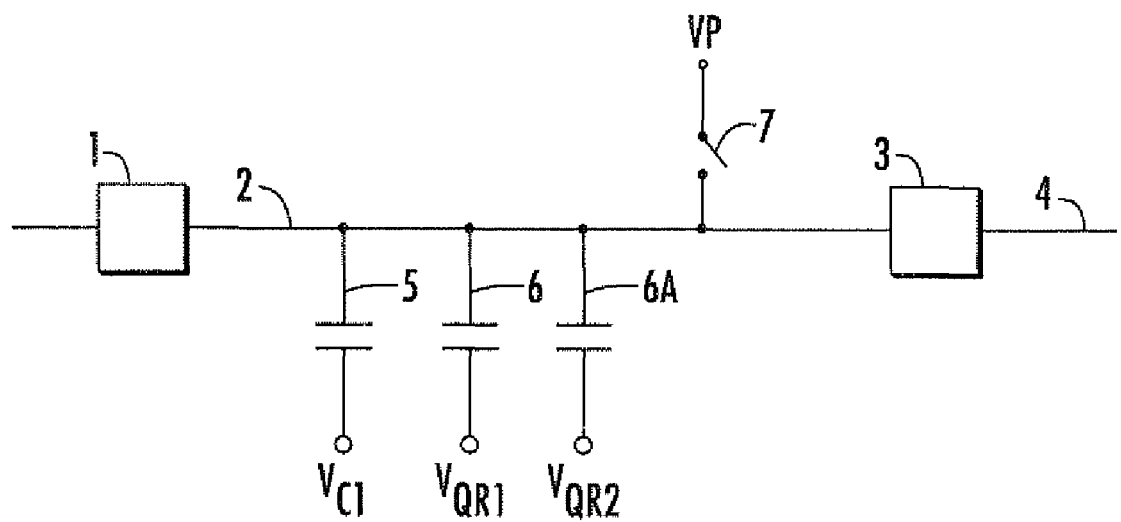
FIG. 11 shows a BBD charge-pipeline stage including conditional charge addition, with the added charge composed of two independent components.

In some ADC implementations it is desirable to provide more than one conditional charge addition in a single pipeline stage. An example of such a stage is shown in FIG. 11. This circuit includes, in addition to the elements in FIG. 9, additional capacitor 6A and voltage source $V_{QR2}$. The operation of such a stage is identical to that of FIG. 8, except that at $t_{3A}$ each of the voltages $V_{QR1}$ and $V_{QR2}$ undergoes an independent conditional transition, of size $V_{R1}$ or $V_{R2}$ respectively. The resulting charge transfer function of the stage is given by:

$$Q_{OUT}=Q_{IN}+C_6\Delta V_{QR1}+C_{6A}\Delta V_{QR2}+Q_{CONST} \quad \text{Equation 2}$$

The same principle can be extended to any number of capacitors and $V_R$ values.

Figure 12:
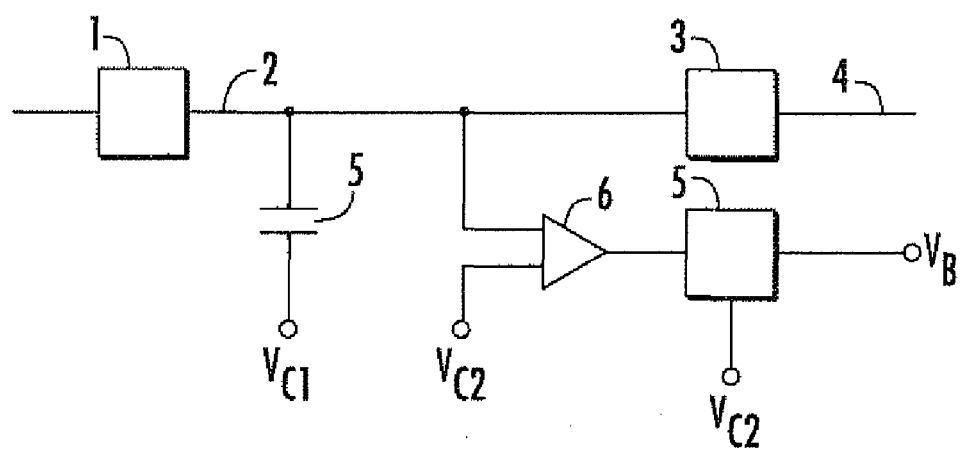
FIG. 12 shows a single-ended BBD charge-pipeline stage including charge comparison.

The remaining operation required for charge-domain ADC operation is charge comparison. FIG. 12 shows a circuit which provides this operation. The circuit of FIG. 12 is identical to that of FIG. 5, with the addition of voltage comparator 8 and latch 9.

Comparator 8 compares the voltage of node 2 with a reference voltage $V_{RC}$. As was pointed out in connection with FIGS. 5 and 6, the voltage at node 2 after $t_2$ depends on the amount of charge transferred into the stage: in FIG. 6, for example, two different incoming charge quantities result in voltages 22A and 22B respectively at node 2. Because of this dependence, voltage comparator 8 accomplishes a comparison of charge on node 2 vs. a reference. Latch 9 captures the result of this comparison at a time between $t_2$ and $t_3$ defined by the digital clock signal $V_{C2}$, and provides a digital output voltage $V_B$.

As was mentioned above, many practical charge-domain pipelined ADCs employ differential circuitry. In such circuitry, signals are represented by pairs of charges whose difference is proportional to the signal. This arrangement permits representation of bipolar signals with unipolar charge packets, and can also provide dynamic range and noise-immunity benefits.

Figure 13:
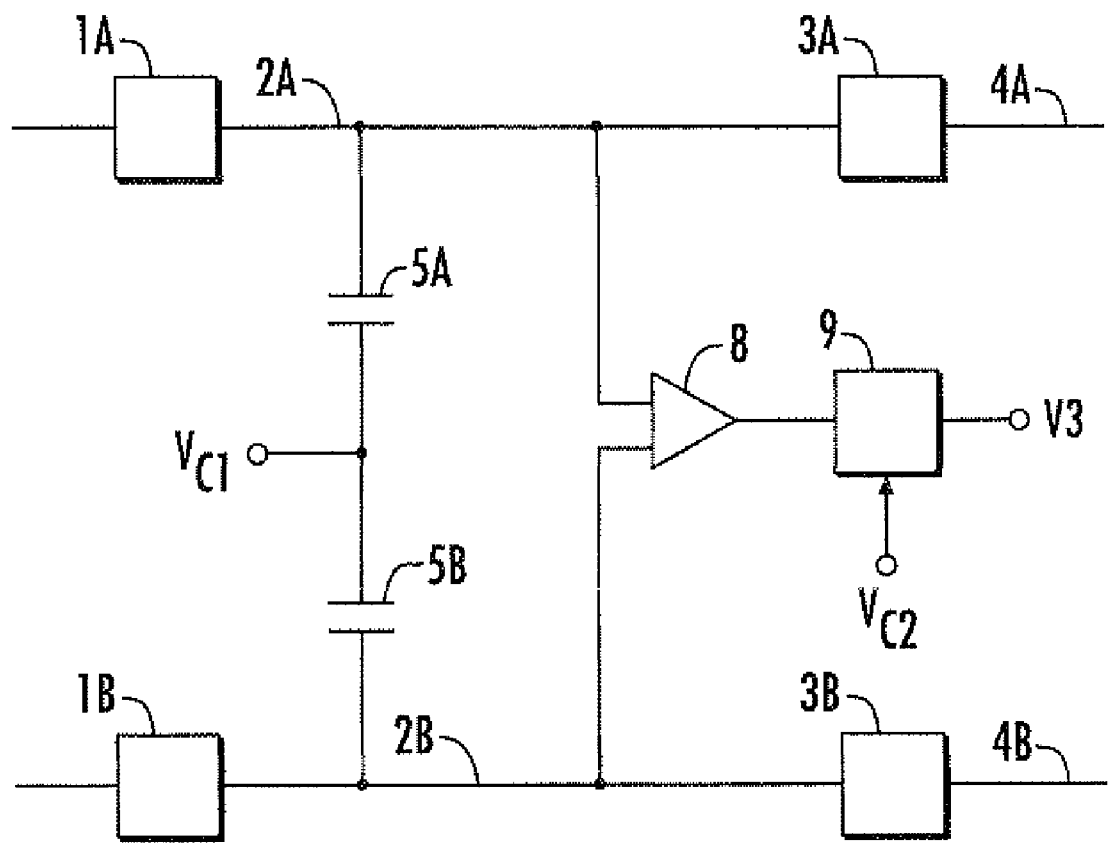
FIG. 13 shows a differential BBD charge-pipeline stage including charge comparison.

FIG. 13 illustrates a differential pipeline stage which is functionally similar to the single-ended stage of FIG. 12. The circuit of FIG. 13 contains two charge pipelines, each identical to that of FIG. 5. The upper pipeline contains elements 1A, 2A, 3A, 4A and 5A, equivalent to elements 1, 2, 3, 4, and 5 in FIG. 5. The lower pipeline contains elements 1B . . . 5B, also equivalent to elements 1 . . . 5 of FIG. 5. The latch 9 in this circuit serves the same function as in FIG. 12. In this differential configuration, however, the comparator 8 compares the voltages of the two charge storage nodes 2A and 2B, rather than comparing to a fixed reference as in FIG. 12. Thus the comparator decision in FIG. 13 is based on the sign of the differential charge signal during the $t_2$-$t_3$ interval.

The several circuit configurations described above provide all the operations needed to carry out pipelined charge-domain A/D conversion: namely charge storage and transfer, charge comparison, and conditional and constant charge addition. These operations can be combined in various ways to carry out a variety of ADC algorithms. Two examples of ADCs based on these operations are given below: one which implements a basic one-bit conversion per pipeline stage; and one which implements an RSD (sometimes called "1.5 bit") conversion per pipeline stage.

Figure 14:
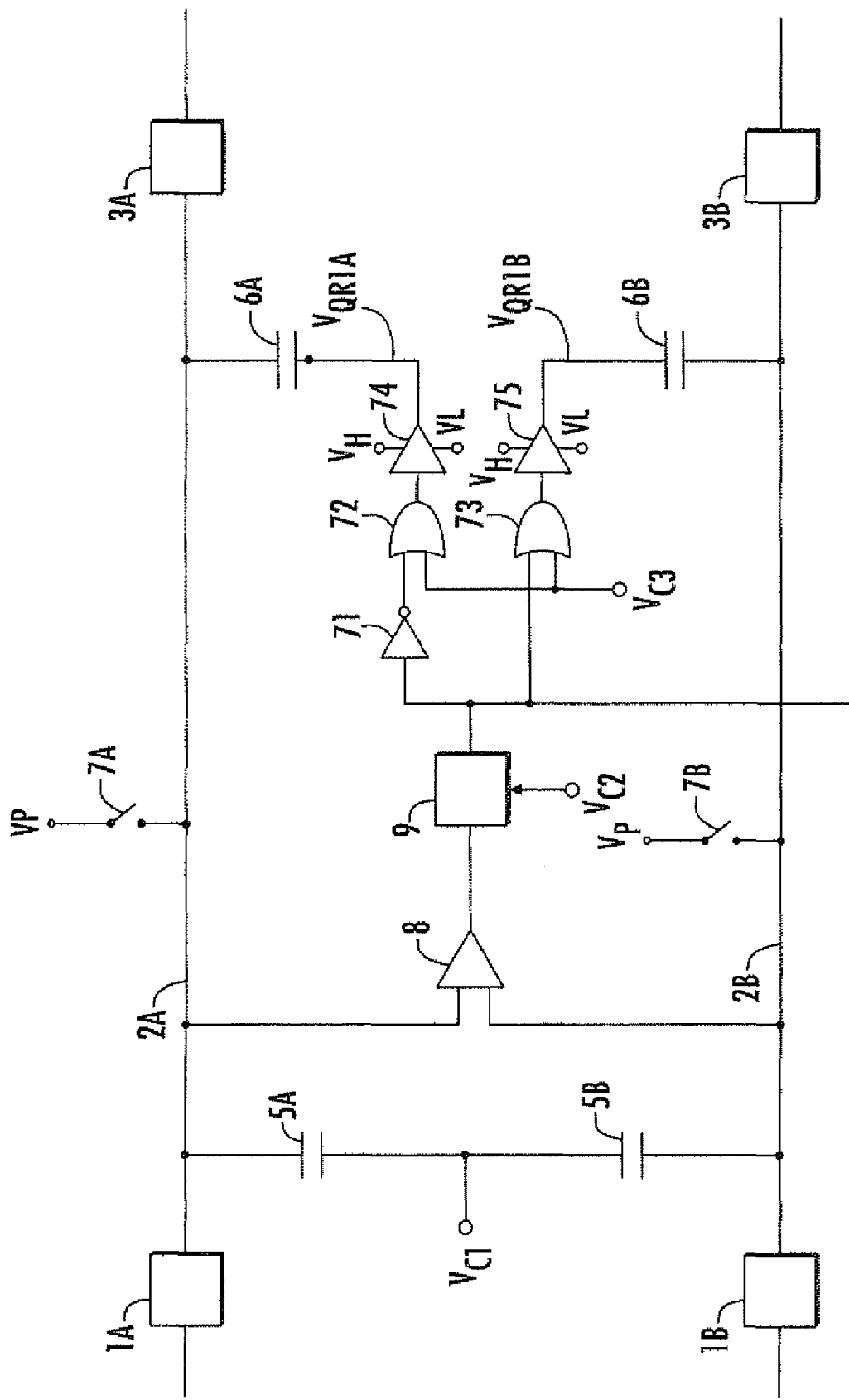
FIG. 14 shows one stage of a differential charge-pipeline ADC which resolves one bit per stage.

FIG. 14 illustrates a differential charge-domain pipeline ADC stage which resolves one bit per stage. The circuit shown combines the basic differential pipeline, comparator, and latch of FIG. 13 with the conditional charge-addition capability of FIG. 9 (used here in differential form). These elements are all identified similarly to the corresponding elements in the previous figures, and operate in the same manner. In addition the circuit of FIG. 14 includes a block of logic circuitry consisting of inverter 71 and OR-gates 72 and 73, plus level-shifters 74 and 75.

In operation, each of the two pipelines operates like the circuit of FIG. 9, with $V_{QR1A}$ and $V_{QR1B}$ each functioning for its respective pipeline like $V_{QR1}$ in FIG. 9. The logic block in FIG. 14 causes either $V_{QR1A}$ or $V_{QR1B}$ (but not both) to switch from a high to a low state at the appropriate time. The exact high and low voltages, $V_H$ and $V_L$, are provided in response to the logic levels at the OR-gate outputs by the level shifters 74 and 75. Operating waveforms for each of the two pipelines in this circuit are the same as those in FIG. 10. Clock voltage $V_{C3}$ determines the timing of $V_{QR1A/B}$ switching, equivalent to $t_{3,4}$ in FIG. 10. Latch 9 is clocked (by clock voltage $V_{C2}$) at a time before or coincident with $V_{QR1A/B}$ switching.

As a result of these operating conditions, the two pipelines in FIG. 14 process charge in accordance with the following equations:

$$Q_{OUTA} = Q_{INA} + C_6 \Delta V_{QR1A} + Q_{CONST} \qquad \text{Equation 3A}$$

$$Q_{OUTB} = Q_{INB} + C_6 \Delta V_{QR1B} + Q_{CONST} \qquad \text{Equation 3B}$$

where $C_6$ is the value of capacitors 6A and 6B and $\Delta V_{QR1A}$ and $\Delta V_{QR1B}$ are equal either to $\Delta V_R = V_L - V_H$, or to zero. (It is assumed here for simplicity that the values of capacitors 6A and 6B are equal, and that both are driven by the same value of $\Delta V_{QR}$; neither of these constraints are essential.) The dependence of the conditional charges in equations 3A and 3B on the comparator decision can be expressed as:

$$C_6 \Delta V_{QR1A} = b C_6 \Delta V_R \qquad \text{Equation 4A}$$

$$C_6 \Delta V_{QR1B} = (1-b) C_6 \Delta V_R \qquad \text{Equation 4B}$$

where b is the value of the output bit decision, with value 1 or 0.

In the differential pipeline configuration, the signal is represented by the difference between the "A" charge and the "B" charge: $Q = Q_A - Q_B$. Thus Equations 3A, 3B, 4A and 4B may be combined to express the overall stage transfer function for differential signal charge:

$$Q_{OUT} = Q_{IN} + (2b-1)C_6 \Delta V_R = Q_{IN} + (2b-1)Q_{STAGE} \qquad \text{Equation 5}$$

where we have defined $Q_{STAGE} = C_6 \Delta V_R$. Equation 5 shows that the stage either adds $Q_{STAGE}$ to the incoming charge (if b=1) or subtracts $Q_{STAGE}$ from the incoming charge (if b=0). This operation is recognizable as one step in the well-known successive-approximation algorithm for A/D conversion, as applied to a signed signal.

A pipeline of N such stages thus produces the charge transfer function:

$$Q_{OUT(N)} = Q_{IN} + (2b_1-1)Q_{STAGE(1)} + (2b_2-1)Q_{STAGE(2)} \ldots + (2b_N-1)Q_{STAGE(N)} \qquad \text{Equation 6}$$

If each stage-charge $Q_{STAGE(k+1)}$ is smaller than the preceding one, $Q_{STAGE(k)}$, then this series of charge comparisons and (signed) additions converges towards $Q_{OUT(N)} = 0$. In particular, if the stage-charges are scaled such that $Q_{STAGE(k+1)} = (\frac{1}{2}) \cdot Q_{STAGE(k)}$, then the sequence of comparator decisions $b_1, b_2, \ldots b_N$ constitute the bits of an N-bit offset-binary approximation to the ratio $Q_{IN}/2Q_{STAGE(1)}$. In this case, the full-scale-range that can be approximated is $-2 Q_{STAGE(1)} \leq Q_{IN} < 2 Q_{STAGE(1)}$.

One property of this algorithm is that, for pipeline input signals that are within the full-scale range of the conversion process, the output differential charge from each stage (k) obeys the condition:

$$|Q_{OUT(k)}| \leq |Q_{STAGE(k)}| \qquad \text{Equation 7}$$

Thus each successive stage needs to process less differential charge than the previous stage. For binary stage scaling, each successive stage needs to process at most half the charge of the previous stage. This fact makes possible another advantage of the present invention.

As was pointed out above, the voltage change at the charge storage node (node 2 in FIG. 9, for example) is $\Delta V = Q_{IN}/C$, where C is the total capacitance at the node. In a practical charge-domain circuit, the maximum voltage change $\Delta V$ at the storage node must be constrained within limits dictated by the semiconductor process used, available clock voltages, etc. For a given charge entering the stage, such limits impose a minimum possible size on total node capacitance in the stage; if we call the maximum allowable voltage swing at the charge storage node $\Delta V_{MAX}$, then we can express the limit on node capacitance as:

$$C_{NODE} > Q_{IN}/\Delta V_{MAX} \qquad \text{Equation 8}$$

A large $C_{NODE}$ value, however, has a disadvantage: it reduces the voltage presented to the comparator by a given charge signal. Consequently for a given comparator voltage resolution (limited by voltage noise or offset, for example) the minimum resolvable charge is inversely proportional to $C_{NODE}$. It would be desirable to reduce $C_{NODE}$ as much as possible, in order to maximize charge resolution (and thus overall ADC resolution in effective bits). Thus the constraint in Equation 8 is in conflict with the goal of high ADC resolution.

The present invention provides a means of satisfying Equation 8 while providing high ADC resolution. Equation 7 indicates that the differential charge signal which each stage in a pipeline needs to process is reduced compared to the previous stage. (It is reduced by a factor of two in a binary pipeline.) Thus the minimum allowable node capacitance required to satisfy Equation 8 with respect to the differential signal charge is smaller for each successive pipeline stage. In order to exploit this opportunity, however, not only the differential charge, but the individual charges comprising the differential pair must be reduced at each successive stage.

The common-mode (CM) charge at each stage is defined as the average of these two charge packets. Even though the signal charge (i.e., the charge-packet difference) is reduced at each stage by the combined actions of comparator and charge addition, the CM charge is not. Using its definition, we can combine Equations 3A, 3B, 4A and 4B and the definition of $Q_{STAGE}$ to obtain:

$$\begin{aligned} Q_{CM\text{-}OUT} &= 1/2(Q_{OUTA} + Q_{OUTB}) \qquad \text{Equation 9} \\ &= 1/2 \left\{ \begin{array}{l} (Q_{INA} + Q_{INB}) + \\ [b + (1-b)]C_6 \Delta V_R + \\ 2Q_{CONST} \end{array} \right\} \\ &= Q_{CM\text{-}IN} + 1/2 C_6 \Delta V_R + Q_{CONST} \\ &= Q_{CM\text{-}IN} + 1/2 Q_{STAGE} + Q_{CONST} \end{aligned}$$

Equation 9 shows that the CM charge changes at each stage by a fixed amount characteristic of that stage. (This amount is independent of the stage's bit decision.) As discussed above, $Q_{STAGE}$ depends on $C_6$ and $\Delta V_R$, while $Q_{CONST}$ depends on $C_5$ and several other voltages. Thus it is possible to select values of $C_6$ and $V_P$, for example, to cause $Q_{CM\text{-}OUT}$ to decrease from stage to stage just as $Q_{STAGE}$ does. The result is that the total capacitance of each stage can be made smaller than the previous one; for binary scaling, it can be approximately one-half the size.

Another operation required for charge-domain ADC operation is charge comparison. FIG. 12 shows a circuit which provides this operation in a single-ended BBD type charge pipeline stage. The circuit of FIG. 8 is identical to that of FIG. 5, with the addition of voltage comparator 8 and latch 9.

Comparator 8 compares the voltage of node 2 with a reference voltage $V_{RC}$. As was pointed out in connection with FIGS. 5 and 6, the voltage at node 2 after $t_2$ depends on the amount of charge transferred into the stage: in FIG. 6, for example, two different incoming charge quantities result in voltages 22A and 22B respectively at node 2. Because of this dependence, voltage comparator 8 accomplishes a comparison of charge on node 2 vs. a reference. Latch 9 captures the result of this comparison at a time between $t_2$ and $t_3$ defined by the digital clock signal $V_{C2}$, and provides a digital output voltage $V_B$.

As was mentioned above, many practical charge-domain pipelined ADCs employ differential circuitry. In such circuitry, signals are represented by pairs of charges whose difference is proportional to the signal. This arrangement permits representation of bipolar signals with unipolar charge packets, and can also provide dynamic range and noise-immunity benefits.

FIG. 13 illustrates a differential pipeline stage which is functionally similar to the single-ended stage of FIG. 12. The circuit of FIG. 13 contains two charge pipelines, each identical to that of FIG. 5. The upper pipeline contains elements 1A, 2A, 3A, 4A and 5A, equivalent to elements 1, 2, 3, 4, and 5 in FIG. 5. The lower pipeline contains elements 1B . . . 5B, also equivalent to elements 1 . . . 5 of FIG. 5. The latch 9 in this circuit serves the same function as in FIG. 12. In this differential configuration, however, the comparator 8 compares the voltages of the two charge storage nodes 2A and 2B, rather than comparing to a fixed reference as in FIG. 12. Thus the comparator decision in FIG. 13 is based on the sign of the differential charge signal during the $t_2$-$t_3$ interval.

The pipelined ADC architecture incorporating this charge and capacitance reduction from stage to stage is termed a "tapered pipeline". It has several important advantages over prior-art BBD-based ADCs: by reducing total capacitance for a series of stages, it reduces operating power; for the same reason it reduces the total "kTC" noise added in the pipeline (thus improving ADC resolution); it increases the charge resolution of comparators in later stages of the pipeline, thus making possible higher overall resolution; and it reduces the total capacitance required for the pipeline, thus reducing circuit area.

In order to exploit the increased comparator charge resolution available in later pipeline stages in a tapered pipeline, an algorithm must be employed which prevents inexact comparator decisions in early stages from compromising precision of the final A/D conversion. A well-known solution to this requirement is the employment of redundancy, such that later stages are able to correct for inexact early decisions. A widely-used algorithm based on this concept is the redundant signed digit (RSD; sometimes referred to as the "1.5 bit-per-stage") algorithm. In this approach, each pipeline stage has two independent comparators with differing thresholds, and two corresponding pairs of conditionally-switched capacitors. The RSD algorithm has been widely implemented in switched-capacitor pipelines, but not previously in charge-domain pipelines. Its use in a BBD charge pipeline is one feature of the present invention.

Figure 15:
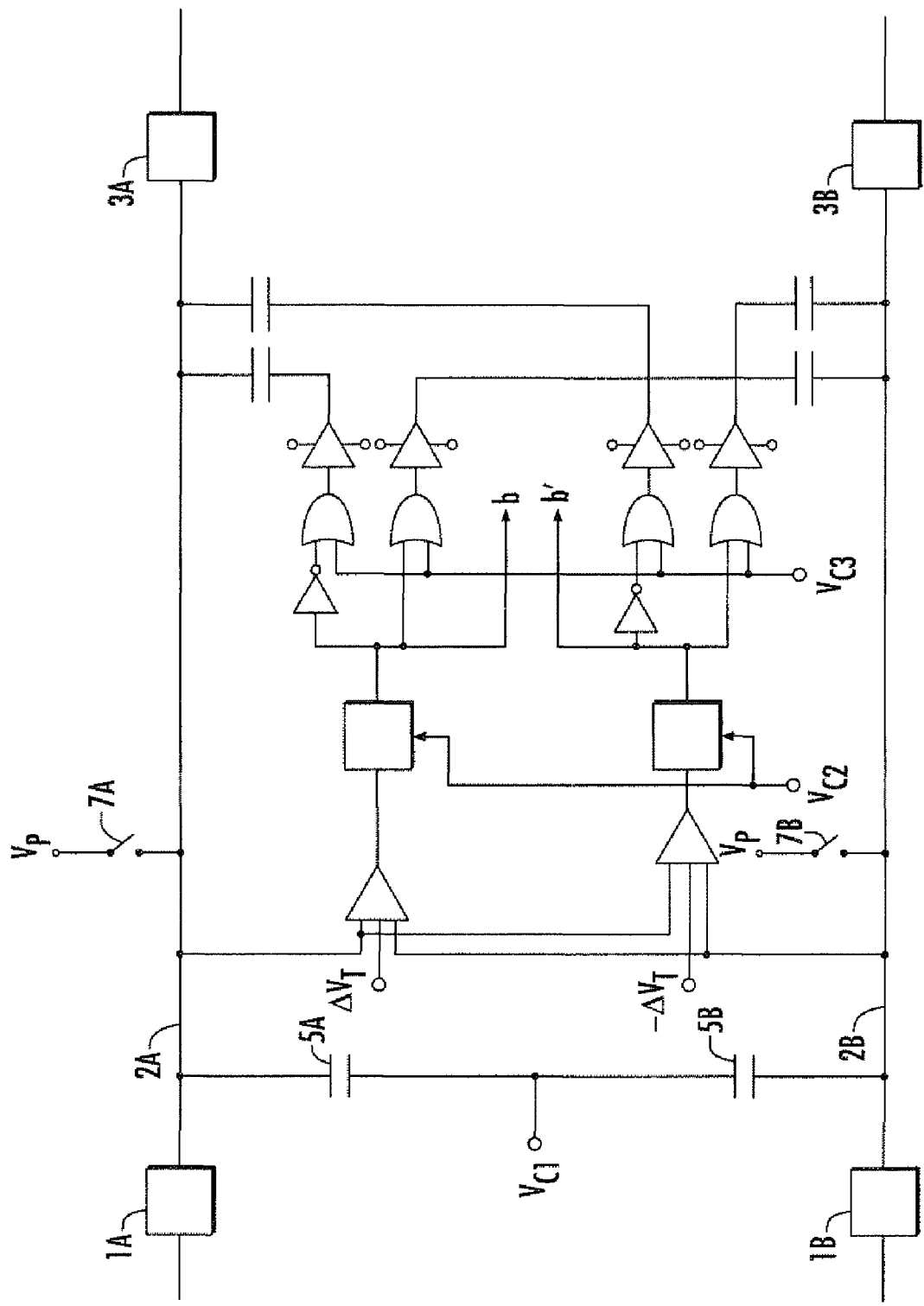
FIG. 15 shows one stage of a differential charge-pipeline ADC which implements the RSD algorithm.

FIG. 15 illustrates one stage of a differential charge-domain pipeline ADC stage which implements the RSD algorithm. It is similar to the circuit of FIG. 14, except that the comparator, latch, logic block, and conditionally-switched capacitors are duplicated. Moreover, the two comparators are provided with shifted thresholds, such that each one switches at a specific charge imbalance between the "A" and "B" storage nodes, rather than switching at the point of balance as in FIG. 14. The comparators typically, although not necessarily, have thresholds symmetrical about the balance point, as indicated in FIG. 15. The two latched comparator decisions are output from the stage as digital signals b and b'.

Assuming that the stage of FIG. 15 is placed in a pipeline where its input charge range is the same as that of the binary stage of FIG. 14, then each of the conditionally-switched capacitors in FIG. 15 is half the size of the corresponding capacitors in FIG. 14. Thus, if both comparators in FIG. 15 are driven to the same decision, indicating a large charge difference between the "A" and "B" storage nodes, then both output bits b and b' have the same value, and both conditionally-switched capacitors on the same branch of the differential charge pair are switched. In this case the stage charge transfer function is given by Equation 5, just as with the circuit of FIG. 14. If the input charge is nearly balanced, however, then b and b' are complementary, and a charge of $\frac{1}{2}Q_{STAGE}$ is added to each outgoing charge packet. In this case the outgoing (differential) signal charge is not changed ($Q_{OUT}=Q_{IN}$).

One result of these operations is that the stage's output charge still obeys Equation 7. Another is that the extra bit resolved per stage provides the desired redundancy, so that later bit-decisions can be used to correct earlier, less exact ones. Thus the improved charge resolution in later stages, provided by the tapered pipeline, can be used to provide overall improved ADC resolution. The charge scaling from stage to stage in this example is still a factor of 2, just as with the binary pipeline ADC described above.

It should be understood that one may apply the principles of chare domain pipeline ADCs as described herein to cable apparatus in various ways. Examples include pipeline ADCs resolving two or more bits per stage, by using multiple comparators and conditionally-switched capacitor pairs.

While this invention has been particularly shown and described with references to example embodiments thereof, it will be understood by those skilled in the art that various changes in form and details may be made therein without departing from the scope of the invention encompassed by the appended claims.

What is claimed is:

1. A cable apparatus comprising:
    an analog front end, coupled to a cable to receive a communication signal;
    a charge-domain pipeline analog-to-digital converter (ADC), coupled to receive the communication signal at an input and provide a digital representation thereof at an output;
    a digital tuner coupled to output of the charge-domain pipeline ADC, the digital tuner configured to separate the digital representation into respective channels; and
    a demodulator coupled to the digital tuner, the demodulator configured to extract information from each respective channel of the digital representation of the communication signal,
    wherein the charge-domain pipeline ADC further comprises two or more bucket-brigade devices (BBDs).

2. The apparatus of claim 1 wherein the BBDs use boosted bucket-brigade charge transfer.

3. The apparatus of claim 2 wherein the BBDs use conditional charge addition in at least one stage.

4. The apparatus of claim 3 wherein the charge-domain pipeline ADC has at least one stage wherein charge is conditionally added to either one but not both charge packets of a differential pair of charges.

5. A cable apparatus comprising:
an analog front end, coupled to a cable to receive a communication signal;
a charge-domain pipeline analog-to-digital converter (ADC), coupled to receive the communication signal at an input and provide a digital representation thereof at an output;
a digital tuner coupled to output of the charge-domain pipeline ADC, the digital tuner configured to separate the digital representation into respective channels; and
a demodulator coupled to the digital tuner, the demodulator configured to extract information from each respective channel of the digital representation of the communication signal
wherein the charge-domain pipeline ADC provides charge comparison against a reference in at least one stage.

6. The apparatus of claim 5 wherein the charge-domain pipeline ADC is a differential charge pipeline using bucket-brigade charge transfer with charge comparison between differential charge-pairs in at least one stage.

7. The apparatus of claim 5 wherein the charge-domain pipeline is a differential charge-domain pipeline using bucket-brigade charge transfer having in at least one stage at least two charge comparisons with differing thresholds between differential charge-pairs.

8. The apparatus of claim 5 wherein later pipeline stages employ smaller capacitances than earlier stages.

9. The apparatus of claim 5 wherein a maximum output charge is reduced in later pipeline stages compared to earlier stages.

10. The apparatus of claim 5 wherein charge-transfer circuits provide control of the charge-transfer direction.

11. The apparatus of claim 5 wherein the charge-domain pipeline ADC implements a redundant signed digit (RSD) analog-to-digital conversion algorithm.

12. A cable apparatus comprising:
an analog front end, for coupling to a cable to receive a communication signal;
a charge-domain pipeline analog-to-digital converter (ADC), coupled to receive the communication signal at an input and provide a digital representation thereof at an output;
a digital tuner coupled to output of the charge-domain pipeline ADC, the digital tuner configured to separate the digital representation into respective channels; and
a demodulator coupled to the digital tuner, the demodulator configured to extract information from each respective channel of the digital representation of the communication signal wherein the charge-domain pipeline ADC further comprises:
a first charge-transfer circuit;
a second charge-transfer circuit;
a node coupled to the first charge-transfer circuit and the second charge-transfer circuit;
a capacitor coupled to the node and to a clocked voltage;
a switched voltage coupled to the node; and
at least one of the first or second charge transfer circuits being a boosted charge-transfer circuit.

13. The apparatus of claim 12 additionally comprising:
control circuitry configured to provide independent control of charge storage and charge-transfer timing between the first charge-transfer circuit and the second charge-transfer circuit.

14. The apparatus of claim 13 wherein the control circuitry provides control of the charge-transfer direction between the first charge-transfer circuit and the second charge-transfer circuit.

15. The apparatus of claim 13 additionally comprising:
a second capacitor coupled to the node and to a conditional voltage, the second capacitor configured to provide conditional charge to the node.

16. The apparatus of claim 15 wherein the second capacitor provides conditional charge to the node based on a comparison of the voltage of the node with a reference voltage.

17. The apparatus of claim 15 additionally comprising:
a plurality of capacitors coupled to the node and to conditional voltages, each of the plurality of capacitors configured to provide conditional charge to the node.

18. The apparatus of claim 12 arranged to provide a differential charge-domain pipeline and further comprising:
a third charge-transfer circuit;
a fourth charge-transfer circuit;
a second node coupled to the third charge-transfer circuit and the fourth charge-transfer circuit;
a second capacitor coupled to the node and to a second clocked voltage; and
a third and fourth capacitor coupled respectively to the first node and second node to provide conditional charge to either the first charge-transfer circuit or the third charge-transfer circuit.

19. The apparatus of claim 17 wherein at least one of the third charge-transfer circuit or the fourth charge-transfer circuit is a boosted charge-transfer circuit.

20. The apparatus of claim 17 wherein the third capacitor provides conditional charge based on a comparison of the voltages of the first node and the second node.

21. The apparatus of claim 17 further comprising: a plurality of conditional charge capacitors coupled to the first and second nodes and configured to provide conditional charge to either the first charge-transfer circuit or the third charge-transfer circuit.

22. The apparatus of claim 21 wherein the plurality of capacitors provide conditional charge based on comparisons of the voltages of the first node and the second node at different thresholds.

23. A cable modem apparatus comprising:
an analog front end, connected to receive an input signal; and
a charge-domain pipeline ADC using bucket-brigade charge transfer, coupled to receive the input signal and further comprising:
a first charge-transfer circuit;
a second charge-transfer circuit;
a node coupled to the first charge-transfer circuit and the second charge-transfer circuit;
a first clocked capacitor coupled to the node and to a clocked voltage; and
a plurality of conditional charge capacitors coupled to the node and to conditional voltages, each of the plurality of conditional charge capacitors configured to provide conditional charge to the node.

24. The apparatus of claim 23 additionally comprising:
a third charge-transfer circuit;
a fourth charge-transfer circuit;
a second node coupled to the third charge-transfer circuit and the fourth charge-transfer circuit;
a second capacitor coupled to the node and to a second clocked voltage; and
a second plurality of conditional charge capacitors coupled to the first node and second node and configured to provide conditional charge to either the first charge-transfer circuit or the third charge-transfer circuit based on comparisons of the voltages of the first node and the second node at different thresholds.

25. The apparatus of claim 23 wherein the pipeline implements an RSD analog-to-digital conversion algorithm.

26. The apparatus of claim 23 wherein the pipeline implements binary stage scaling.

27. The apparatus of claim 23 arranged to provide a differential charge-domain pipeline and further comprising:
a third charge-transfer circuit;
a fourth charge-transfer circuit; and
a third and fourth capacitor coupled to the first node and second node, respectively, and configured to provide conditional charge to either the first charge-transfer circuit or the third charge-transfer circuit.

28. A cable gateway comprising:
a pipelined charge-domain ADC using bucket-brigade charge transfer that further comprises:
a plurality of charge-transfer circuits coupled in a cascading arrangement through a plurality of nodes, each node further coupled to a respective capacitor, where the maximum output charge provided by each node is less than that of earlier of nodes; and
control circuitry configured to provide independent control of charge storage and charge-transfer timing between the plurality of charge-transfer circuits.

29. A method comprising:
receiving a communication signal;
analog to digital converting the communication signal using a charge-domain pipeline, the charge domain pipeline transferring charge between pipeline stages using bucket-brigade charge transfer, to provide a digital representation of the communication signal;
separating the digital representation into two or more respective communication channels; and
demodulating the communication channels, to thereby extract information from two or more of the respective communication channels.

30. The method of claim 29 wherein the communication signal is received from a cable gateway.

31. The method of claim 29 additionally comprising:
boosting the bucket-brigade charge transfer between at least two stages.

32. The method of claim 29 further comprising:
conditionally adding a charge to at least one stage of the charge-domain pipeline.

33. The method of claim 29 further comprising:
conditionally adding a charge to either one, but not both, charges of a differential pair of charges.

34. The method of claim 29 wherein the charge-domain pipeline is a differential charge pipeline and further comprising:
comparing charge between differential charge pairs in at least one stage.

35. The method of claim 34 additionally comprising:
comparing at least two charges against different thresholds between differential charge pairs.

36. The method of claim 29 wherein the step of analog to digital converting further comprises using a Redundant Signed Digit (RSD) algorithm.

37. The method of claim 29 wherein the step of analog to digital converting further comprises:
applying a charge to a first charge-transfer circuit;
applying a charge to a second charge-transfer circuit;
coupling outputs of the first charge-transfer circuit and the second charge-transfer circuit;
clocking a capacitor coupled to the outputs; and
switching a voltage on the capacitor.

38. The method of claim 37 additionally comprising:
controlling charge storage and charge-transfer timing individually between the first charge-transfer circuit and the second charge-transfer circuit.

* * * * *